(12) United States Patent
Lim et al.

(10) Patent No.: US 10,410,793 B2
(45) Date of Patent: Sep. 10, 2019

(54) THIN FILM CAPACITOR AND METHOD OF MANUFACTURING THE SAME

(71) Applicant: SAMSUNG ELECTRO-MECHANICS CO., LTD., Suwon-si, Gyeonggi-do (KR)

(72) Inventors: Seung Mo Lim, Suwon-si (KR); Hyun Ho Shin, Suwon-si (KR); Sang Jong Lee, Suwon-si (KR); Yun Sung Kang, Suwon-si (KR); Woong Do Jung, Suwon-si (KR); Sung Sun Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/404,357

(22) Filed: Jan. 12, 2017

(65) Prior Publication Data
US 2017/0338039 A1 Nov. 23, 2017

(30) Foreign Application Priority Data
May 19, 2016 (KR) .................. 10-2016-0061227

(51) Int. Cl.
*H01G 4/33* (2006.01)
*H01G 4/236* (2006.01)
(Continued)

(52) U.S. Cl.
CPC ............... *H01G 4/33* (2013.01); *H01G 4/232* (2013.01); *H01G 4/236* (2013.01); *H01G 4/30* (2013.01); *H01G 4/012* (2013.01); *H05K 1/162* (2013.01)

(58) Field of Classification Search
CPC .................................. H01G 4/30; H01G 4/33
(Continued)

(56) References Cited

U.S. PATENT DOCUMENTS 8,343,361 B2 1/2013 Takeshima et al.
8,605,410 B2 12/2013 Oikawa et al.
(Continued)

FOREIGN PATENT DOCUMENTS

CN 1366686 A 8/2002
CN 1612273 A 5/2005
(Continued)

OTHER PUBLICATIONS

Korean Office Action dated Mar. 20, 2017, issued in Korean patent application No. 10-2016-0061227. (w/ English translation).
(Continued)

*Primary Examiner* — Eric W Thomas
(74) *Attorney, Agent, or Firm* — Morgan, Lewis & Bockius LLP

(57) ABSTRACT

A thin film capacitor includes: a body formed by alternately stacking first and second electrode layers, with dielectric layers therebetween on a substrate. A plurality of first vias are disposed in the body and electrically connected to the first electrode layers. A plurality of second vias are disposed in the body, electrically connected to the second electrode layers, and disposed alternately with the first vias. A first connection electrode is disposed on an upper surface of the body and connected to the plurality of first vias, a second connection electrode is disposed on the upper surface of the body and connected to the plurality of second vias, and first and second electrode pads are disposed on the first and second connection electrodes, respectively, and formed to not overlap the plurality of first and second vias.

30 Claims, 10 Drawing Sheets

(51) Int. Cl.
    *H01G 4/232*     (2006.01)
    *H01G 4/30*     (2006.01)
    *H01G 4/012*     (2006.01)
    *H05K 1/16*     (2006.01)

(58) Field of Classification Search
    USPC .................................................... 361/301.4
    See application file for complete search history.

(56) References Cited

U.S. PATENT DOCUMENTS

| | | | |
|---|---|---|---|
| 2002/0158307 A1 | 10/2002 | Honda et al. | |
| 2005/0111162 A1 | 5/2005 | Osaka et al. | |
| 2010/0238603 A1* | 9/2010 | Chung | H01G 4/228 |
| | | | 361/301.4 |
| 2010/0252527 A1 | 10/2010 | Takeshima et al. | |
| 2017/0330688 A1* | 11/2017 | Lim | H01G 4/005 |
| 2017/0338042 A1* | 11/2017 | Shin | H01G 4/33 |

FOREIGN PATENT DOCUMENTS

| | | | | |
|---|---|---|---|---|
| CN | 101896985 A | 11/2010 | | |
| JP | 07-326536 A | 12/1995 | | |
| JP | 2010-225849 A | 10/2010 | | |
| JP | 4930602 B2 | 5/2012 | | |
| JP | 2014-090077 A | 5/2014 | | |
| JP | 2015-070058 A | 4/2015 | | |
| WO | WO-2016158228 A1 * | 10/2016 | ............... | H01G 4/33 |

OTHER PUBLICATIONS

Office Action issued in Chinese Patent Application No. 201710064214.9 dated Jul. 3, 2019, with English translation.

\* cited by examiner

THIN FILM CAPACITOR AND METHOD OF MANUFACTURING THE SAME

CROSS-REFERENCE TO RELATED APPLICATION

This application claims benefit of priority to Korean Patent Application No. 10-2016-0061227 filed on May 19, 2016 in the Korean Intellectual Property Office, the disclosure of which is incorporated herein by reference in its entirety.

BACKGROUND

1. Field

The present disclosure relates to a thin film capacitor and a method of manufacturing the same.

2. Description of Related Art

Recently, in accordance with the thinning of an application processor (AP) of a smartphone, there has been an increased need for a thin film capacitor thinner than a multilayer ceramic capacitor (MLCC).

While a reduced thickness may be implemented in a thin film capacitor using thin film technology, this may significantly limit the number of dielectric layers that can be stacked as compared to an MLCC, which may make it difficult to achieve high capacitance.

A thin film capacitor with significantly reduced impedance is required in order to effectively transmit or process a high frequency signal, but high inductance may be generated due to characteristics of the capacitor at high frequencies. Therefore, the capacitor should be manufactured to have low equivalent series inductance (ESL).

Where electrodes connect dielectric layers to each other with vias, vias with dimples may be formed, and electrode pads can be formed on the vias. In this case, the electrode pads are formed based on the shapes of the vias, such that dimples may be generated in the electrode pads. This may reduce the area of the electrodes contacting a board when mounting the thin film capacitor on the board, which may lead to problems such as a contact defect.

A method of efficiently and stably connecting a plurality of dielectric layers to external electrodes is required.

Japanese Patent Laid-Open Publication No. 2010-225849, Japanese Patent Laid-Open Publication No. 2014-090077, and Japanese Patent Laid-Open Publication No. 2015-070058 relate to a thin film capacitor.

SUMMARY

An exemplary embodiment of the present disclosure may provide a thin film capacitor in which electrode pads may be formed adjacent to vias disposed in parallel to prevent defects occurring in the vias while reducing equivalent series inductance (ESL) and equivalent series resistance (ESR), and a method of manufacturing the same.

According to an exemplary embodiment of the present disclosure, a thin film capacitor may include: a body including first and second electrode layers alternately stacked with dielectric layers, above a substrate. A plurality of first vias may be disposed in the body and electrically connected to the first electrode layers. A plurality of second vias may be disposed in the body, electrically connected to the second electrode layers, and disposed alternately with the first vias. A first connection electrode may be disposed on an upper surface of the body and connected to the plurality of first vias, and a second connection electrode may be disposed on the upper surface of the body and connected to the plurality of second vias. First and second electrode pads may be disposed on the first and second connection electrodes, respectively, and formed to not overlap the plurality of first or second vias in a stacking direction of the body, whereby equivalent series inductance (ESL) and equivalent series resistance (ESR) of the thin film capacitor may be reduced.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Thin film capacitors according to exemplary embodiments in the present disclosure will hereinafter be described.

Figure 1:
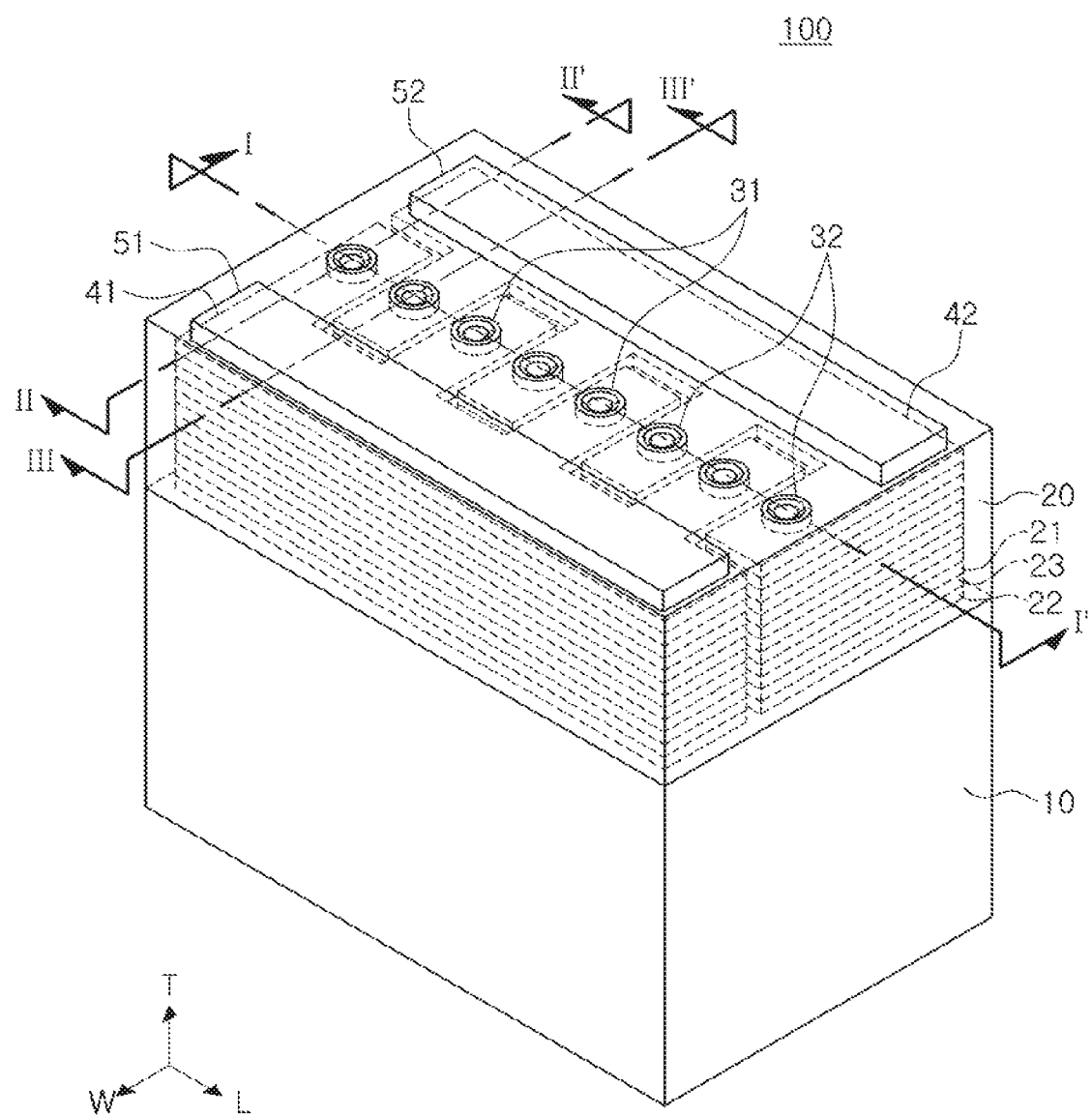
FIG. 1 is a schematic perspective view illustrating a thin film capacitor according to an exemplary embodiment in the present disclosure.
Figure 2:
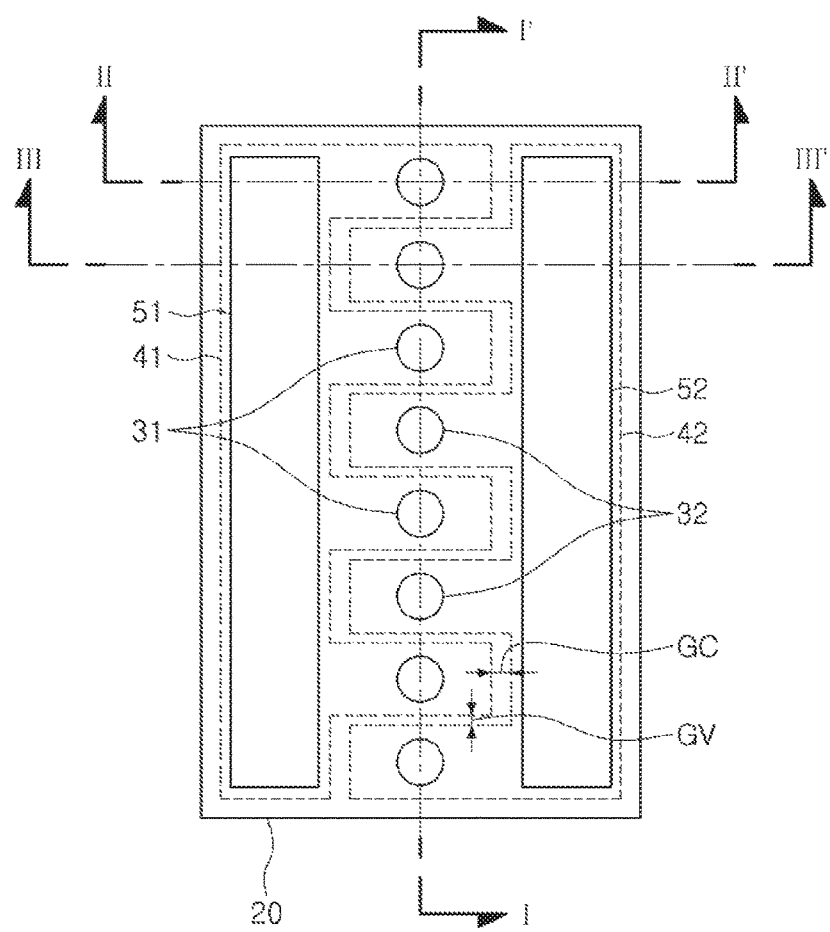
FIG. 2 is schematic plan view illustrating a thin film capacitor according to an exemplary embodiment in the present disclosure.

FIG. 1 is a schematic perspective view illustrating a thin film capacitor according to an exemplary embodiment in the present disclosure. FIG. 2 is a schematic plan view illustrating a thin film capacitor according to an exemplary embodiment in the present disclosure.

Referring to FIGS. 1 and 2, a thin film capacitor 100 according to an exemplary embodiment in the present disclosure may include a body 20 formed by alternately stacking first and second electrode layers 21 and 22 with dielectric layers 23 therebetween, on a substrate 10. A plurality of first vias 31 are disposed in the body 20 and electrically connected to the first electrode layers 21. A plurality of second vias 32 are disposed in the body 20, are electrically connected to the second electrode layers 22, and are disposed alternately with the first vias 31. First and second electrode pads 51 and 52 are disposed above the body 20 in positions that do not overlap the first or second vias 31 and 32 in a stacking direction of the body. A first connection electrode 41 is disposed on the body 20 and connects the first electrode pad 51 to the first vias 31. A second connection electrode 42 is disposed on the body 20 and connects the second electrode pad 52 to the second vias 32.

The substrate 10 may be insulated from the electrode layers, and may be formed of a material selected from the group consisting of $Al_2O_3$, $SiO_2$/Si, MgO, $LaAlO_3$, and $SrTiO_3$, but is not limited thereto. The substrate 10 may have sufficient flatness and surface roughness.

Figure 3:
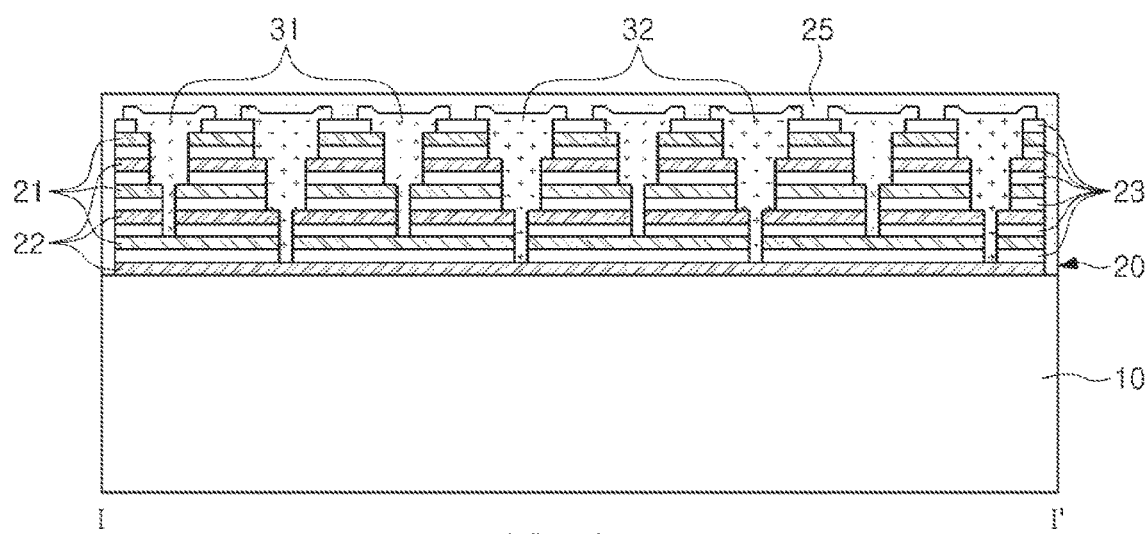
FIG. 3 is a schematic cross-sectional view of a thin film capacitor according to an exemplary embodiment in the present disclosure, taken along line I-I' of FIG. 1.
Figure 4A:
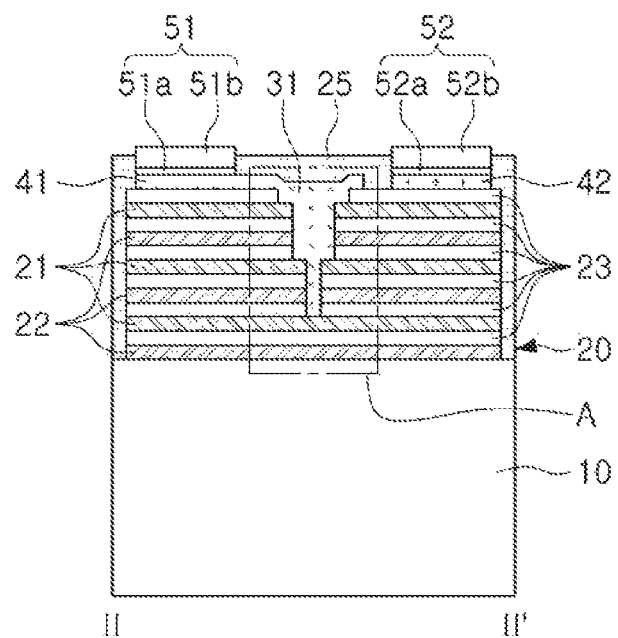
FIGS. 4A and 4B are cross-sectional views taken along lines II-II' and of FIG. 1, respectively.
Figure 4B:
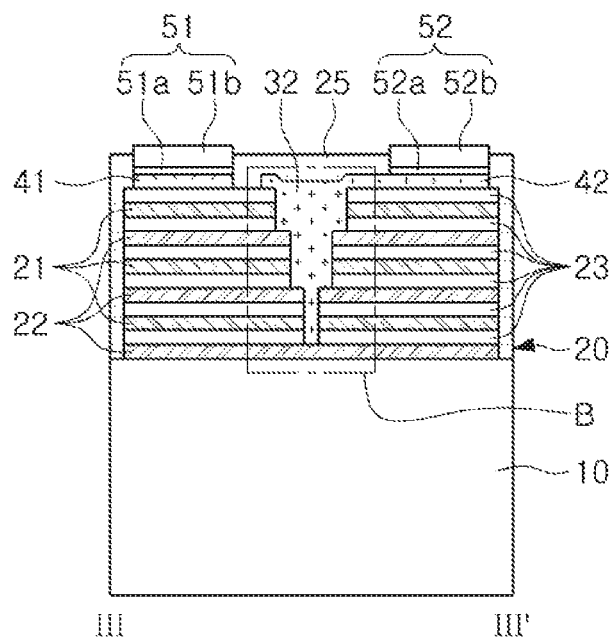

FIG. 3 is a schematic cross-sectional view of a thin film capacitor according to an exemplary embodiment in the present disclosure, taken along line I-I' of FIG. 1. FIG. 4A is a cross-sectional view taken along line II-II' of FIG. 1. FIG. 4B is a cross-sectional view taken along line of FIG. 1.

Referring to FIGS. 3, 4A, and 4B, the body 20 may have a stacked structure in which the second electrode layer 22 is formed on the substrate 10, the dielectric layer 23 is formed on the second electrode layer 22, and the first electrode layer 21 is formed on the dielectric layer 23. A plurality of first electrode layers 21 and second electrode layers 22 are thus alternately stacked with respective dielectric layers 23 interposed therebetween. However, the numbers of first and second electrode layers 21 and 22 and dielectric layers 23 are not limited to those illustrated in the drawings.

As the number of first and second electrode layers 21 and 22 and dielectric layers 23 increase, equivalent series resistance (ESR) of the thin film capacitor may be reduced.

The first and second electrode layers 21 and 22 may be layers that do not have predetermined patterns.

The first and second electrode layers 21 and 22 may be formed of a conductive material.

The conductive material may be copper (Cu), aluminum (Al), gold (Au), silver (Ag), platinum (Pt), iridium (Ir), ruthenium (Ru), $IrO_2$, $RuO_2$, or the like, but is not limited thereto.

High temperature may be generated while forming a dielectric layer, that is, a thin film having a high dielectric constant. As a result, an electrode layer may diffuse into the dielectric layer or react with the dielectric layer, which may increase a leakage current in the resulting capacitor.

The first and second electrode layers 21 and 22 may be formed of platinum (Pt), a high melting point material, to suppress platinum (Pt) from being diffused into the dielectric layer or reacting to the dielectric layer.

The dielectric layer 23 may include a perovskite material, a material having a high dielectric constant.

The perovskite material may be a dielectric material where the dielectric constant can be significantly changed, such as a barium titanate ($BaTiO_3$)-based material, a strontium titanate ($SrTiO_3$)-based material, a $(Ba,Sr)TiO_3$-based material, a PZT-based material, or the like, but is not limited thereto.

Figure 5A:
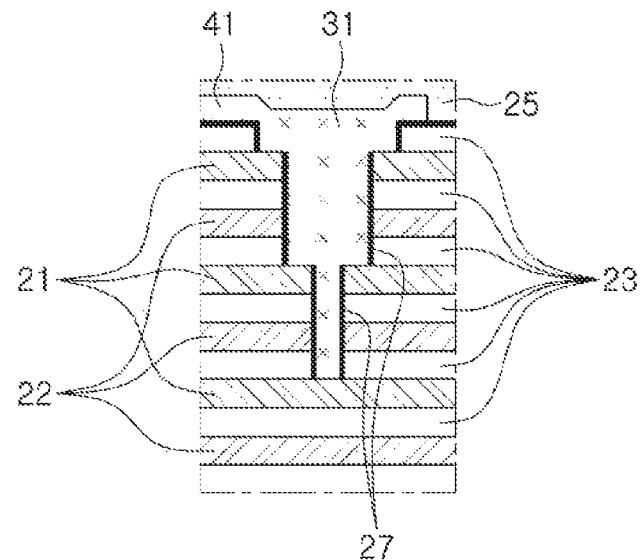
FIGS. 5A and 5B are enlarged views of part A of FIG. 4A and part B of FIG. 4B, respectively.
Figure 5B:
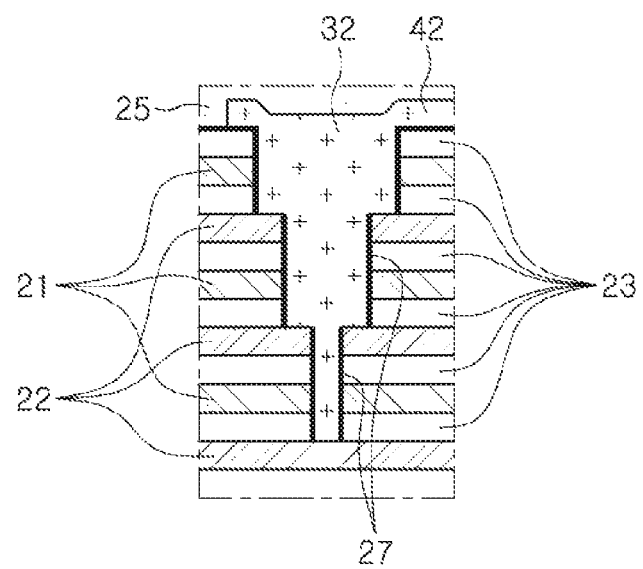

FIG. 5A is an enlarged view of part A of FIG. 4A. FIG. 5B is an enlarged view of part B of FIG. 4B.

In the present disclosure, the terms "first" and "second" indicate different polarities.

Referring to FIGS. 5A and 5B, the first vias 31 may be electrically connected to the first electrode layers 21, the second vias 32 may be electrically connected to the second electrode layers 22, and the first vias 31 and the second vias 32 may be electrically insulated from each other.

The first and second vias 31 and 32 may be formed of a conductive material, and may be formed by a plating process. Therefore, dimples may be formed in upper surfaces of the first and second vias 31 and 32.

The conductive material may be copper (Cu), aluminum (Al), gold (Au), silver (Ag), platinum (Pt), or the like, but is not limited thereto.

The first and second vias 31 and 32 may each be formed in plural. When the first and second vias 31 and 32 are formed in plural, contact surfaces of the first and second vias 31 and 32 contacting the first and second electrode layers 21 and 22, respectively, may be increased to reduce ESR of the thin film capacitor.

The first and second connection electrodes 41 and 42 may respectively connect the first and second vias 31 and 32 to the respective first and second electrode pads 51 and 52.

The first and second connection electrodes 41 and 42 may be formed of a conductive material, and may be formed by a plating process.

The conductive material may be copper (Cu), aluminum (Al), gold (Au), silver (Ag), platinum (Pt), or the like, but is not limited thereto.

The first and second electrode pads 51 and 52 may include a conductive material.

The conductive material may be copper (Cu), aluminum (Al), gold (Au), silver (Ag), platinum (Pt), or the like, but is not limited thereto.

The first and second electrode pads 51 and 52 may include seed layers 51a and 52a and electrode layers 51b and 52b on the seed layers 51a and 52a, respectively.

The first and second electrode pads 51 and 52 may be disposed in positions not overlapping the first or second vias 31 and 32 in the stacking direction of the body.

The first and second electrode pads 51 and 52 may be integrated with the first and second connection electrodes 41 and 42, respectively, or may be disposed on the first and second connection electrodes 41 and 42, respectively.

According to the related art, when connecting electrodes to each other using vias, after vias with dimples are formed, electrode pads are formed on the vias. The electrode pads are thus formed based on the shapes of the vias, which may generate dimples in the electrode pads. This may reduce the area of the electrodes contacting a board when mounting the thin film capacitor on the board and may cause problems such as a contact defect.

In contrast, according to an exemplary embodiment in the present disclosure, the first and second electrode pads 51 and 52 can be formed at positions that do not overlap the first or second vias 31 and 32, and as such can be flat surfaces that do not cause dimples to be formed in the first and second electrode pads. Therefore, problems such as a contact defect between the electrodes and a board and delamination of the vias from the thin film capacitor at the time of mounting the thin film capacitor on the board may be resolved.

The first and second vias 31 and 32 may be spaced apart from the first and second electrode pads 51 and 52, respectively, by the same distance. Therefore, stress from pressure at the time of mounting the thin film capacitor on the board may be concentrated on the first and second electrode pads 51 and 52, which can reduce or eliminate stress applied to the first and second vias 31 and 32. This can suppress delamination of the vias caused by pressure when mounting the thin film capacitor.

The plurality of first and second vias 31 and 32 may be alternately disposed in one direction, and may reduce equivalent series inductance (ESL) of the thin film capacitor.

The direction in which the plurality of first and second vias 31 and 32 are disposed may be changed based on the length or a width of the target thin film capacitor. For example, the plurality of first and second vias 31 and 32 may be alternately disposed in a length direction or a width direction.

The first vias 31 and the second vias 32 may be disposed as close to each other as possible, which can suppress magnetic induction from currents flowing in the first and second vias 31 and 32.

That is, when the first vias 31 and the second vias 32, with currents flowing in opposite directions, are close to each other, the magnetic induction is offset and thus suppressed, which reduces the ESL of the thin film capacitor.

Therefore, having the first vias 31 and the second vias 32 as close to each other as possible results in an excellent ESL reduction effect. FIG. 2 illustrates an example of this, with the first and second vias 31 and 32 alternately disposed and aligned in a straight line.

Due to a disposition of the first and second vias 31 and 32, the first and second connection electrodes 41 and 42 may have comb shapes. The comb shapes of the first and second connection electrodes 41 and 42 may be engaged with each other and may be alternately disposed.

The first connection electrode 41 may include a plurality of first connection parts respectively connected to the plurality of first vias and a first electrode part connected to the plurality of first connection parts. The second connection electrode 32 may include a plurality of second connection parts respectively connected to the plurality of second vias and a second electrode part connected to the plurality of second connection parts.

Since the first connection electrode and the second connection electrode have polarities opposing each other, when the first connection electrode and the second connection electrode are as close to each other as possible, an excellent ESL reducing effect may be secured.

The plurality of first and second connection parts may have branch forms that respectively extend from the plurality of first and second vias.

The first electrode part may be one electrode connecting the plurality of first connection parts to one another, and the second electrode part may be one electrode connecting the plurality of second connection parts to one another. In this case, the first and second electrode pads 51 and 52 may be formed on the first and second electrode parts, respectively.

Referring to FIGS. 5A and 5B, the first and second vias 31 and 32 need to be connected to the plurality of first and second electrode layers 21 and 22, respectively. The first and second vias 31 and 32 may therefore have stepped shapes in both side surfaces thereof.

Surfaces of the first vias 31 and the second vias 32 facing the substrate with stepped shapes may contact the first and second electrode layers 21 and 22, respectively, in order for the first vias 31 and the second vias 32 to be electrically connected to the first electrode layers 21 and the second electrode layers 22, respectively.

Insulating layers 27 may be formed in order for the first vias 31 and the second vias 32 to be electrically connected only to the first electrode layers 21 and the second electrode layers 22, respectively.

The insulating layers 27 may be formed so that they are between the first vias 31 and the dielectric layers 23 and between the first vias 31 and the second electrode layers 22. Insulating layers 27 may also be formed between the second vias 32 and the dielectric layers 23 and between the second vias 32 and the first electrode layers 21.

That is, the insulating layers 27 may insulate the first vias 31 from the second electrode layers 22 and may insulate the second vias 32 from the first electrode layers 21. The insulating layers 27 may be formed on surfaces of the dielectric layers 23 to reduce parasitic capacitance generated in the dielectric layers 23.

The insulating layer 27 may be formed of an organic material such as benzocyclobutene (BCB), a polyimide, or the like, or an inorganic material such as $SiO_2$, $Si_3N_4$, or the like, and may be formed of a material having a dielectric constant lower than that of the dielectric layer 23 in order to increase insulating properties and reduce parasitic capacitance.

The insulating layer 27 may be formed by a chemical vapor deposition (CVD) method that may form a layer at a uniform thickness in a three-dimensionally complicated shape.

A protection layer 25 may be formed in order to prevent the body 20 and the first and second connection electrodes 41 and 42 from being deteriorated or polluted due to external humidity or a chemical reaction to external oxygen and to prevent the body 20 and the first and second connection electrodes 41 and 42 from being damaged when mounting the thin film capacitor on the board.

The protection layer 25 may be formed of a material having high heat resistance, for example, an organic thermosetting material or photo-curable material such as a polyimide.

Figure 6:
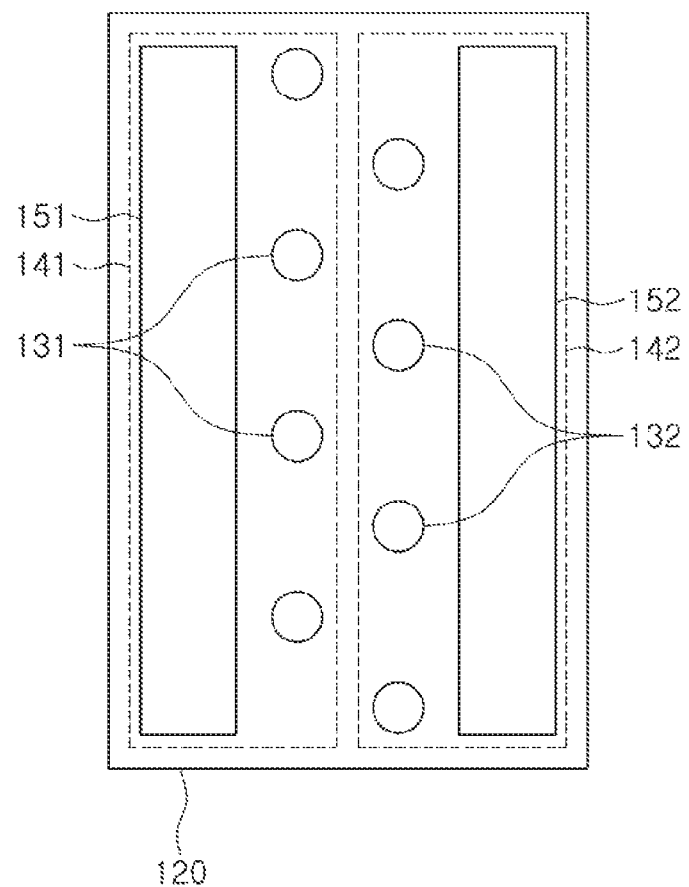
FIGS. 6 and 7 are schematic plan views illustrating thin film capacitors according to other exemplary embodiments in the present disclosure.
Figure 7:
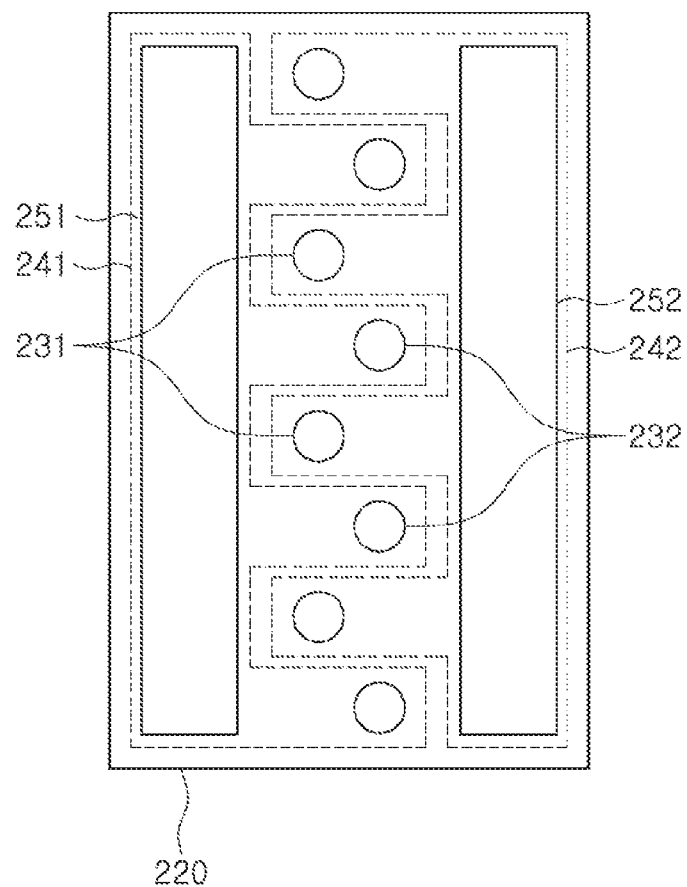

FIGS. 6 and 7 are schematic plan views illustrating thin film capacitors according to other exemplary embodiments in the present disclosure.

An overlapping description of components described above and illustrated in FIGS. 1 through 5B is omitted below.

Referring to FIG. 6, a thin film capacitor may include a plurality of first and second vias 131 and 132 alternately disposed in zigzag form in one direction, and first and second connection electrodes 141 and 142 connecting the plurality of first and second vias 131 and 132 to one another, respectively. The first connection electrode may be one electrode connecting the plurality of first vias 131 to one another, and the second connection electrode may be one electrode connecting the plurality of second vias 32 to one another.

Referring to FIG. 7, a thin film capacitor may include first and second vias 231 and 232 alternately disposed in zigzag form in one direction, and the first and second connection electrodes 241 and 242 can have comb shapes. Since the first and second connection electrodes 241 and 242 are as close to each other as possible, an ESL reducing effect may be secured.

A method of manufacturing a thin film capacitor according to the present disclosure will hereinafter be described.

Figure 8:
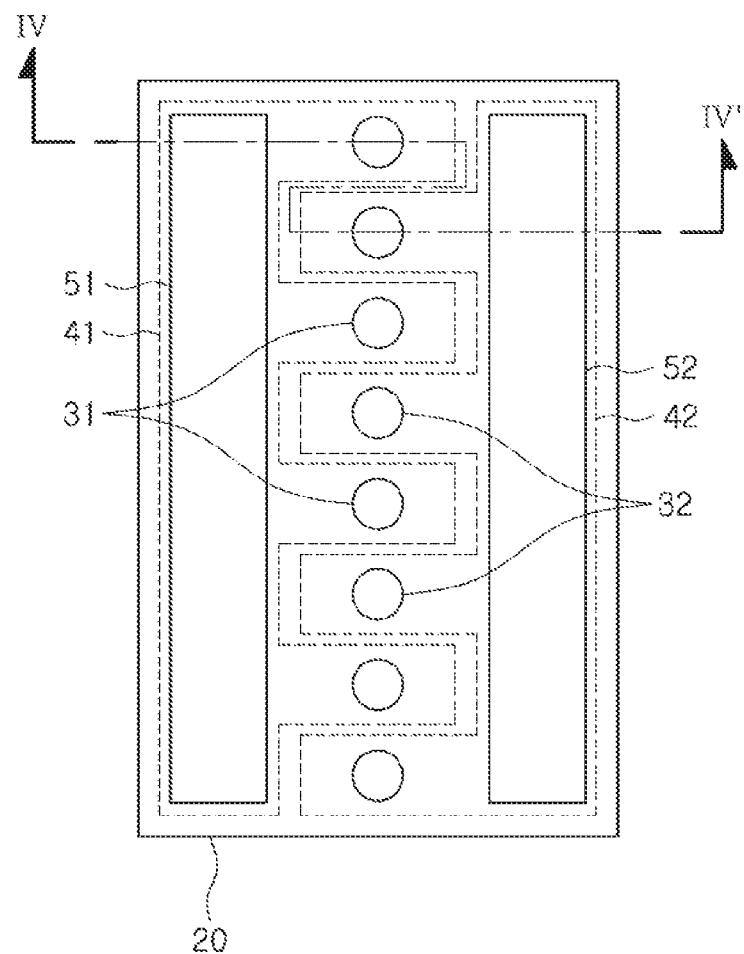
FIG. 8 is schematic plan view illustrating a thin film capacitor according to another exemplary embodiment in the present disclosure.

FIG. 8 is a schematic plan view illustrating a thin film capacitor according to an exemplary embodiment in the present disclosure. FIGS. 9A through 9F are schematic cross-sectional views illustrating a process of manufacturing a thin film capacitor according to an exemplary embodiment in the present disclosure, taken along path IV-IV' of FIG. 8.

Referring to FIGS. 9A through 9F, a method of manufacturing a thin film capacitor according to an exemplary embodiment in the present disclosure may include alternately stacking first and second electrode layers 21 and 22 and dielectric layers 23 to form a body 20. A plurality of first vias 31 and a plurality of second vias 32 can be formed in the body 20 in a stacking direction of the body 20, with the plurality of first vias 31 electrically connected to the first electrode layers 21 and the plurality of second vias 32 electrically connected to the second electrode layers 22 and disposed alternately with the first vias 31. A first connection electrode 41 and a second connection electrode 42 can be formed on an upper surface of the body 20, with the first connection electrode 41 connected to the plurality of first vias 31 and the second connection electrode 42 connected to the plurality of second vias 32. First and second electrode pads 51 and 52 can be formed so that they are connected to the first and second connection electrodes 41 and 42, respectively, and are disposed in positions that do not overlap the first or second vias 31 and 32 in the stacking direction.

Figure 9A:
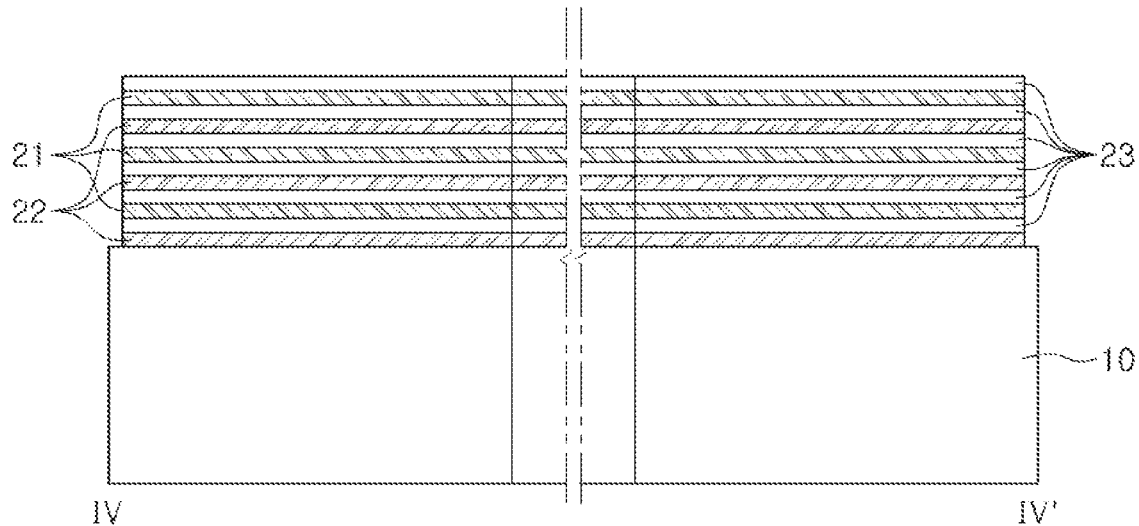
FIGS. 9A through 9F are schematic cross-sectional views illustrating a process of manufacturing a thin film capacitor according to an exemplary embodiment in the present disclosure, taken along path IV-IV' of FIG. 8.

Referring to FIG. 9A, the first and second electrode layers 21 and 22 and the dielectric layers 23 may be alternately stacked on the substrate 10 to form the body 20.

The substrate 10 may be insulated from the electrode layers, and may be formed of a material selected from the group consisting of $Al_2O_3$, $SiO_2/Si$, MgO, $LaAlO_3$, and $SrTiO_3$, but is not limited thereto. The substrate 10 may have sufficient flatness and surface roughness.

The first and second electrode layers 21 and 22 may be formed of a conductive material. The conductive material may be, for example, copper (Cu), aluminum (Al), gold (Au), silver (Ag), platinum (Pt), iridium (Ir), ruthenium (Ru), $IrO_2$, $RuO_2$, or the like.

The first and second electrode layers 21 and 22 may be formed by a vapor phase synthesis method such as a sputtering method, a vapor deposition method, or the like, and may be processed by a photolithography process and a dry etching process.

The dielectric layer 23 may include a perovskite material, a material having a high dielectric constant.

The perovskite material may be a dielectric material where the dielectric constant can be significantly changed, such as a barium titanate ($BaTiO_3$)-based material, a strontium titanate ($SrTiO_3$)-based material, a $(Ba,Sr)TiO_3$-based material, a PZT-based material, or the like, but is not limited thereto.

The dielectric layer 23 may be formed by a sol-gel method, a sputtering method, a laser ablation method, or the like.

Surface treatment may be performed on the first and second electrode layers or the dielectric layer.

The surface treatment, a process of planarizing a surface, may be performed by etching and polishing, and may be, for example, a dry etching method such as an ion beam etching method or a chemical mechanical polishing (CMP) method, but is not limited thereto.

Figure 9B:
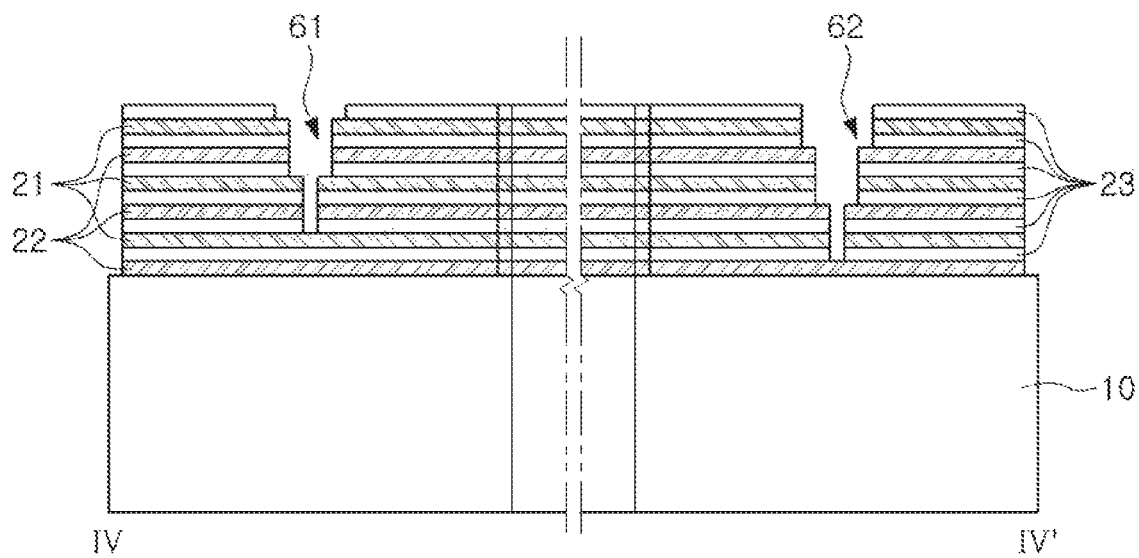
Figure 9C:
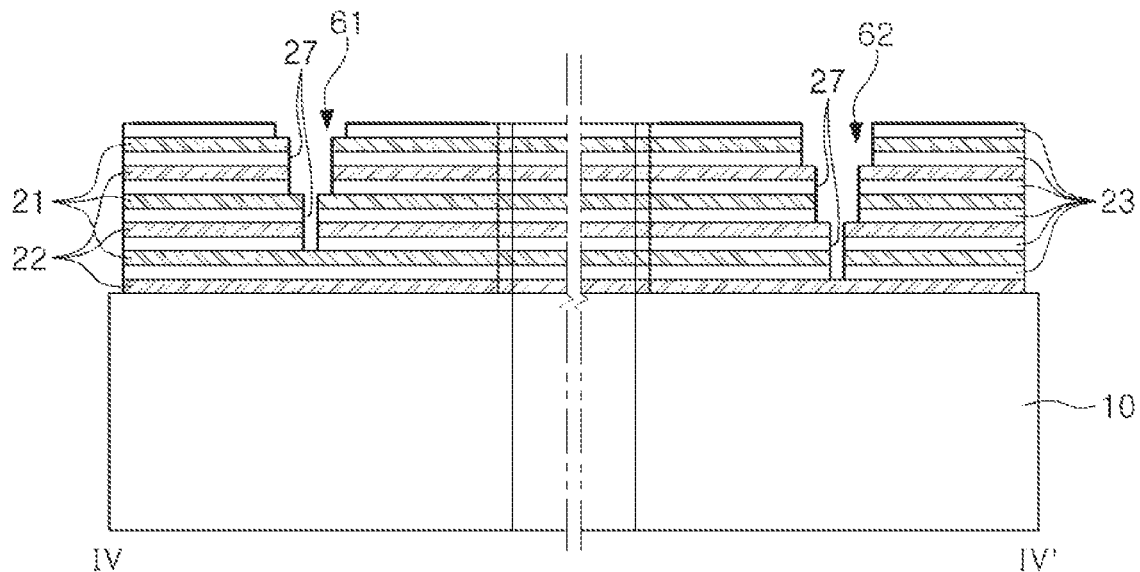
Figure 9D:
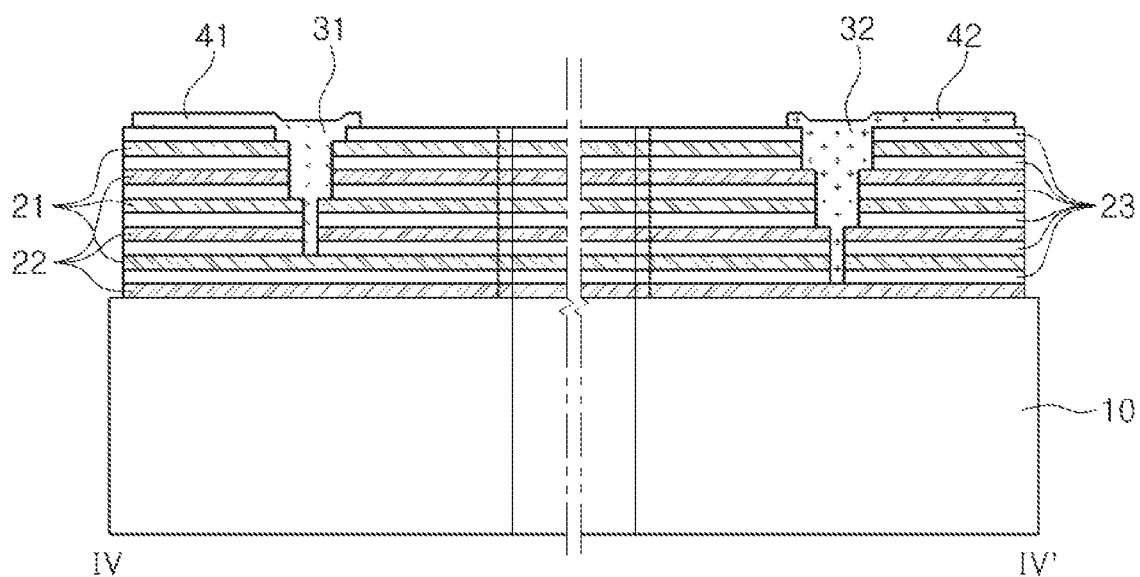

Next, referring to FIGS. 9B through 9D, the plurality of first vias 31 and second vias 32, electrically connected to the first and second electrode layers 21 and 22, respectively, and alternately disposed, may be formed in the body 20 in the stacking direction of the body 20. Then, the first and second connection electrodes 41 and 42 connected to the first and second vias 31 and 32, respectively, may be formed.

The first and second vias 31 and 32 may be alternately disposed in one direction, and may be alternately disposed on the same line. When the first vias 31 and the second vias 32 are close to each other, currents may be generated in directions that offset magnetic induction, such that magnetic induction may be suppressed, thereby reducing ESL of the thin film capacitor.

The first and second vias 31 and 32 may be alternately disposed in zigzag form in one direction.

The first and second vias 31 and 32 may be formed by alternately forming a plurality of first and second via holes 61 and 62 in one direction in the body 20 in the stacking direction of the body 20 (see FIG. 9B) and filling the first and second via holes with a conductive material (see FIG. 9D).

A method of filling the first and second via holes with the conductive material may be performed by plating.

The first and second via holes may be formed by a laser punching method or a mechanical punching method, but are not limited thereto.

The conductive material may be copper (Cu), aluminum (Al), gold (Au), silver (Ag), platinum (Pt), or the like, but is not limited thereto.

Referring to FIG. 9C, insulating layers 27 may be formed in the first and second via holes before the first and second via holes are filled with the conductive material.

The insulating layers 27 may be formed in the first via holes 61 to cover the dielectric layers 23 and the second electrode layers 22, and may be formed in the second via holes 62 to cover the dielectric layers 23 and the first electrode layers 21.

The insulating layer 27 may be formed of an organic material such as benzocyclobutene (BCB), a polyimide, or the like, or an inorganic material such as $SiO_2$, $Si3N_4$, or the like, and may be formed of a material having a dielectric constant smaller than that of the dielectric layer 23 in order to increase insulating properties and reduce parasitic capacitance.

The insulating layer 27 may be formed by a chemical vapor deposition (CVD) method.

Referring to FIG. 9D, the first and second connection electrodes 41 and 42 connected to the plurality of first and second vias 31 and 32, respectively, may be formed.

Due to a disposition of the first and second vias 31 and 32, the first and second connection electrodes 41 and 42 may have comb shapes. The comb shapes of the first and second connection electrodes 41 and 42 may be engaged with each other and alternately disposed.

The first and second connection electrodes 41 and 42 may be formed of a conductive material, and may be formed using a plating process.

The conductive material may be copper (Cu), aluminum (Al), gold (Au), silver (Ag), platinum (Pt), or the like, but is not limited thereto.

Figure 9E:
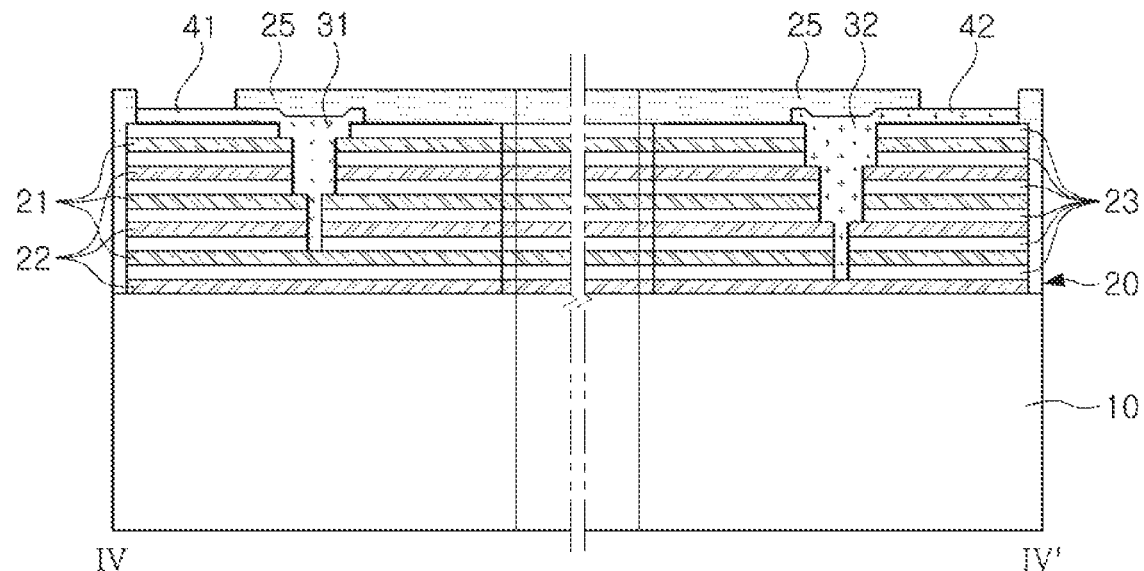

Next, referring to FIG. 9E, a protection layer 25 may be formed to cover the body 20 and the first and second connection electrodes.

The protection layer 25 may be formed of a material having high heat resistance, for example, an organic thermosetting material or a photo-curable material such as a polyimide.

The protection layer 25 may be formed by exposure and development processes of a photoresist, a spray applying process, a dipping method using a low-viscosity polymer coating solution, but is not limited thereto.

Figure 9F:
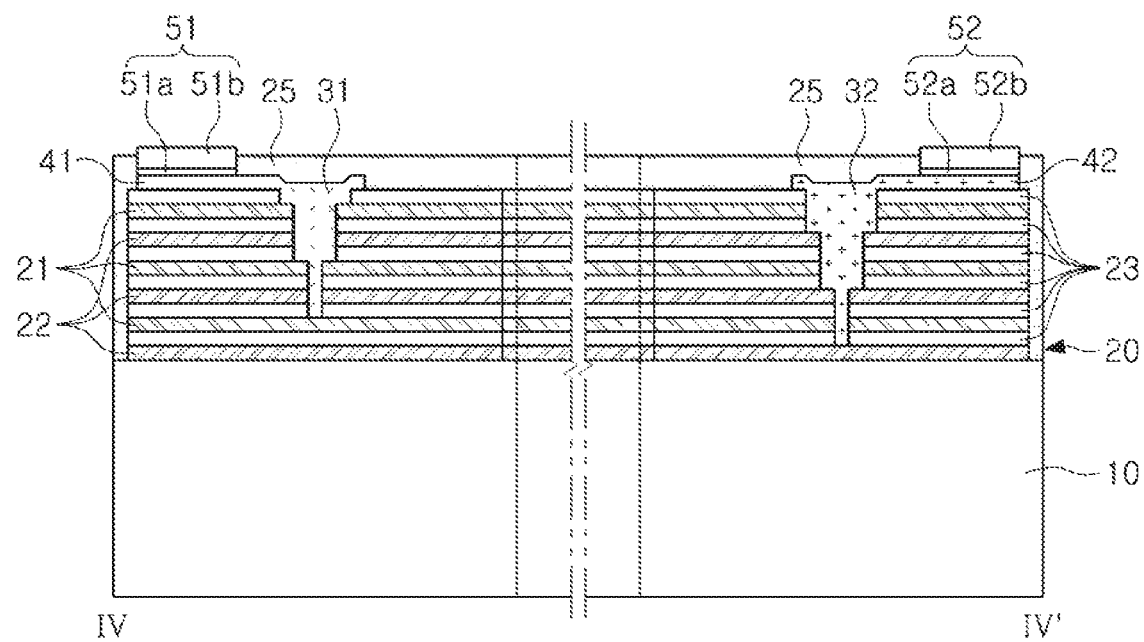

Next, referring to FIG. 9F, the first and second electrode pads 51 and 52 connected to the first and second connection electrodes 41 and 42, respectively, and disposed in positions that do not overlap the first or second vias 31 and 32, may be formed.

The first and second electrode pads 51 and 52 may include a conductive material, and may be formed by a plating process.

The first and second electrode pads 51 and 52 may be formed on flat surfaces that do not overlap the first or second vias 31 and 32, so that the first and second electrode pads 51 and 52 do not form with dimples. Therefore, problems such as a contact defect between the electrodes and a board and delamination of the vias from the thin film capacitor when mounting the thin film capacitor on the board may be solved.

In addition, since the first and second electrode pads 51 and 52 are not formed on the first and second vias 31 and 32, a polishing process for removing the dimples of the vias may be omitted, such that the number of processes may be significantly reduced and manufacturing costs may be reduced.

The first and second electrode pads 51 and 52 may be integrated with the first and second connection electrodes 41 and 42, respectively, or may be disposed on the first and second connection electrodes 41 and 42, respectively.

The first and second electrode pads 51 and 52 may be formed by forming seed layers 51a and 52a and then forming electrode layers 51b and 52b on the seed layers 51a and 52a, respectively, by a plating process.

The conductive material may be copper (Cu), aluminum (Al), gold (Au), silver (Ag), platinum (Pt), or the like, but is not limited thereto.

As set forth above, in the thin film capacitor according to the exemplary embodiment in the present disclosure, the electrode pads may be disposed so as to not overlap the vias to prevent defects occurring while reducing ESL and ESR of the thin film capacitor.

While exemplary embodiments have been shown and described above, it will be apparent to those skilled in the art that modifications and variations could be made without departing from the scope of the present invention as defined by the appended claims.

What is claimed is:

1. A thin film capacitor comprising:
   a body with first and second electrode layers alternately stacked with dielectric layers;
   a plurality of first vias disposed in the body and electrically connected to the first electrode layers;
   a plurality of second vias disposed in the body, electrically connected to the second electrode layers, and disposed alternately with the first vias;
   first and second electrode pads disposed above the body in positions that do not overlap the first or second vias in a stacking direction of the body;
   a first connection electrode disposed on the body and connecting the first electrode pad to the first vias; and
   a second connection electrode disposed on the body and connecting the second electrode pad to the second vias,
   wherein one or more of the plurality of first vias are in direct contact with an upper surface of each of the first electrode layers, and one or more of the plurality of second vias are in direct contact with an upper surface of each of the second electrode layers, and
   wherein each via of the pluralities of first and second vias has an upper surface having a dimple depression, and the first and second electrode pads are laterally offset relative to the dimple depressions of the pluralities of first and second vias.

2. The thin film capacitor of claim 1, wherein the first and second vias are alternately disposed in one direction.

3. The thin film capacitor of claim 2, wherein the first and second vias are alternately disposed and aligned in a straight line.

4. The thin film capacitor of claim 2, wherein the first and second vias are alternately disposed in zigzag form in one direction.

5. The thin film capacitor of claim 2, wherein the first and second vias are alternately disposed in a length direction of the thin film capacitor.

6. The thin film capacitor of claim 2, wherein the first and second vias are alternately disposed in a width direction of the thin film capacitor.

7. The thin film capacitor of claim 1, wherein the first and second vias are spaced apart from the first and second electrode pads, respectively, by a same distance.

8. The thin film capacitor of claim 1, wherein the first and second connection electrodes have comb shapes.

9. The thin film capacitor of claim 8, wherein the comb shapes of the first and second connection electrodes are engaged with each other and are alternately disposed.

10. The thin film capacitor of claim 1, wherein
   the first connection electrode includes a plurality of first connection parts respectively connected to the plurality of first vias and a first electrode part connected to the plurality of first connection parts, and
   the second connection electrode includes a plurality of second connection parts respectively connected to the plurality of second vias and a second electrode part connected to the plurality of second connection parts.

11. The thin film capacitor of claim 1, wherein the first and second electrode pads are formed above the first and second connection electrodes, respectively.

12. The thin film capacitor of claim 1,
   wherein one of the plurality of first vias has a first portion with a first width and a second portion with a second width different from the first width,
   wherein at least one of the first electrode layers has a first via hole with the first width and at least one of the second electrode layers has a second via hole with the first width, and
   wherein the first portion is in the first via hole and the second via hole.

13. The thin film capacitor of claim 1, wherein the first via has a first portion with a first width that is substantially constant along a first thickness and a second portion with a second width different from the first width and that is substantially constant along a second thickness.

14. The thin film capacitor of claim 1,
   wherein the plurality of first vias are each electrically connected to all of the first electrode layers and have a stepped shape with steps at upper surfaces of the first electrode layers, and
   wherein the plurality of second vias are each electrically connected to all of the second electrode layers and have a stepped shape with steps at upper surfaces of the second electrode layers.

15. A method of manufacturing a thin film capacitor, comprising:
   alternately stacking first and second electrode layers with dielectric layers therebetween to form a body;
   forming a plurality of first vias and a plurality of second vias in the body in a stacking direction of the body, so that the plurality of first vias are electrically connected to the first electrode layers, so that the plurality of second vias are electrically connected to the second electrode layers and are disposed alternately with the first vias, and so that each via of the pluralities of first and second vias has an upper surface having a dimple depression;
   forming a first connection electrode and a second connection electrode on an upper surface of the body, the first connection electrode being connected to the plurality of first vias and the second connection electrode being connected to the plurality of second vias; and
   forming first and second electrode pads connected to the first and second connection electrodes, respectively, and disposed in positions that do not overlap the first or second vias in a stacking direction of the body so as to be laterally offset relative to the dimple depressions of the pluralities of first and second vias,
   wherein one or more of the plurality of first vias are in direct contact with an upper surface of each of the first electrode layers, and one or more of the plurality of second vias are in direct contact with an upper surface of each of the second electrode layers.

16. The method of claim 15, wherein the first and second vias are alternately disposed in one direction.

17. The method of claim 16, wherein the first and second vias are alternately disposed and aligned in a straight line.

18. The method of claim 16, wherein the first and second vias are alternately disposed in zigzag form in one direction.

19. The method of claim 15, wherein the first and second vias are spaced apart from the first and second electrode pads, respectively, by a same distance.

20. The method of claim 15, wherein the first and second connection electrodes have comb shapes.

21. The method of claim 20, wherein the comb shapes of the first and second connection electrodes are engaged with each other and are alternately disposed.

22. The method of claim 15, wherein the forming of the plurality of first vias and the plurality of second vias includes:
    forming a plurality of first via holes and a plurality of second via holes in the body in the stacking direction of the body; and
    filling the plurality of first via holes and the plurality of second via holes with a conductive material to form the plurality of first vias and the plurality of second vias.

23. The method of claim 15, wherein the first and second electrode pads are formed above the first and second connection electrodes, respectively.

24. A thin film capacitor, comprising:
    a body, including a plurality of first and second electrode layers alternately stacked with dielectric layers;
    a plurality of first and second vias electrically connected to the first and second electrode layers, respectively; and
    first and second electrode pads electrically connected to the first and second vias, respectively,
    wherein the plurality of first and second vias are alternately disposed and aligned in a straight line,
    wherein one or more of the plurality of first vias are in direct contact with an upper surface of each of the first electrode layers, and one or more of the plurality of second vias are in direct contact with an upper surface of each of the second electrode layers, and
    wherein each via of the pluralities of first and second vias has an upper surface having a dimple depression, and the first and second electrode pads are laterally offset relative to the dimple depressions of the pluralities of first and second vias.

25. The thin film capacitor of claim 24, wherein the first and second electrode pads are above the body and do not overlap the first or second vias in a stacking direction.

26. The thin film capacitor of claim 25, further comprising:
    a first connection electrode above the body and connecting each of the first vias to the first electrode pad; and
    a second connection electrode above the body and connecting each of the second vias to the second electrode pad,
    wherein the first and second connection electrodes have comb shapes interlocked with each other.

27. A thin film capacitor, comprising:
    a body, including a plurality of first and second electrode layers alternately stacked with dielectric layers;
    a plurality of first vias, each electrically connected to the first electrode layers and with a stepped shape with steps at upper surfaces of the first electrode layers;
    a plurality of second vias, each electrically connected to the second electrode layers and with a stepped shape with steps at upper surfaces of the second electrode layers; and
    first and second electrode pads electrically connected to the first and second vias, respectively,
    wherein one or more of the plurality of first vias are in direct contact with an upper surface of each of the first electrode layers, and one or more of the plurality of second vias are in direct contact with an upper surface of each of the second electrode layers, and
    wherein each via of the pluralities of first and second vias has an upper surface having a dimple depression, and the first and second electrode pads are laterally offset relative to the dimple depressions of the pluralities of first and second vias.

28. The thin film capacitor of claim 27, wherein the first and second electrode pads are above the body and do not overlap the first or second vias in a stacking direction.

29. The thin film capacitor of claim 27, further comprising:
    insulating layers distinct from the dielectric layers and disposed on the sides of the plurality of first and second vias in a stacking direction of the body,
    wherein the insulating layers in each of the plurality of first vias expose the upper surface of each of the first electrode layers to the first via, and
    the insulating layers in each of the plurality of second vias expose the upper surface of each of the second electrode layers to the second via.

30. The thin film capacitor of claim 27, further comprising:
    a first connection electrode electrically connecting each of the first vias to the first electrode pad; and
    a second connection electrode electrically connecting each of the second vias to the second electrode pad,
    wherein the first and second vias are alternately disposed and aligned in a straight line, and
    wherein the first and second connection electrodes have comb shapes interlocked with each other.

* * * * *